US012700861B2

(12) United States Patent
Chen

(10) Patent No.: US 12,700,861 B2
(45) Date of Patent: Aug. 4, 2026

(54) GATE DRIVER CIRCUIT CAPABLE OF PREVENTING SPIKES

(71) Applicant: Richtek Technology Corporation, Hsinchu (TW)

(72) Inventor: Ping-Liang Chen, Taipei (TW)

(73) Assignee: Richtek Technology Corporation, Hsinchu (TW)

( * ) Notice: Subject to any disclaimer, the term of this patent is extended or adjusted under 35 U.S.C. 154(b) by 61 days.

(21) Appl. No.: 18/744,745

(22) Filed: Jun. 17, 2024

(65) Prior Publication Data

US 2025/0337407 A1 Oct. 30, 2025

(30) Foreign Application Priority Data

Apr. 25, 2024 (TW) ................................. 113115573

(51) Int. Cl.
*H03K 17/16* (2006.01)
(52) U.S. Cl.
CPC . *H03K 17/163* (2013.01); *H03K 2217/94047* (2013.01)
(58) Field of Classification Search
CPC ................... H03K 17/163; H03K 2217/94047
See application file for complete search history.

(56) References Cited

U.S. PATENT DOCUMENTS

| | | | |
|---|---|---|---|
| 2022/0199002 A1 | 6/2022 | Verschueren et al. | |
| 2023/0291305 A1* | 9/2023 | Tiruchengode ..... | H02M 1/0009 |

FOREIGN PATENT DOCUMENTS

| | | | |
|---|---|---|---|
| CN | 115864790 A * | 3/2023 | |
| WO | 2006/138066 A1 | 12/2006 | |
| WO | 2020/051138 A1 | 3/2020 | |

* cited by examiner

*Primary Examiner* — Daniel C Puentes
(74) *Attorney, Agent, or Firm* — Huan-Yi Lin

(57) ABSTRACT

A gate driver circuit provides a soft-start current to a gate of a power switch during a soft-start period to soft-start the power switch. The gate driver circuit includes: a first current mirror circuit, configured to mirror a reference current according to a mirror ratio to generate a mirror output current; and a path switch coupled on a signal path between the mirror output current and the soft-start current. The soft-start current is generated according to the mirror output current. The path switch is configured to turn off the signal path when the power switch is off. The mirror ratio of the first current mirror circuit is reduced during a predetermined period in the soft-start period to compensate for a spike caused by the path switch being turned on during the soft-start period, such that the soft-start current is prevented from surging during the soft-start period.

9 Claims, 8 Drawing Sheets

GATE DRIVER CIRCUIT CAPABLE OF PREVENTING SPIKES

CROSS REFERENCE

The present invention claims priority to the TW patent application No. 113115573, filed on Apr. 25, 2024.

BACKGROUND OF THE PRESENT INVENTION

Field of Invention

The present invention relates to a gate driver circuit, and particularly to a gate driver circuit capable of preventing spikes.

Description of Related Art

FIG. 1 shows a circuit schematic diagram of a prior art gate driver circuit. The gate driver circuit shown in FIG. 1 utilizes a current mirror to limit the initial gate driving current, thereby achieving a soft-start effect. However, when a path switch Sp switches, a voltage at node A fluctuates, causing a voltage at node B to increase and thereby increasing a mirror output current t Imr. Due to the large size ratio between transistor MP1 and transistor MP2, for example, 1:50, the mirror output current Imr is amplified tens of times, counteracting the original purpose of limiting the current.

SUMMARY OF THE PRESENT INVENTION

In one aspect, the present invention provides a gate driver circuit for providing a soft-start current to a gate of a power switch during a soft-start period to soft-start the power switch, the gate driver circuit comprising: a first current mirror circuit configured to mirror a reference current according to a mirror ratio to generate a mirror output current, wherein the soft-start current is generated according to the mirror output current; and a path switch coupled to a signal path between the mirror output current and the soft-start current and configured to turn off the signal path when the power switch is turned off; wherein, during a predetermined period within the soft-start period, the mirror ratio of the first current mirror circuit is reduced to compensate for a spike caused by the path switch being turned on during the soft-start period, so as to prevent the soft-start current from surging during the soft-start period.

In one preferred embodiment, the gate driver circuit further includes a second current mirror circuit configured to mirror the mirror output current to generate the soft-start current, wherein the path switch is coupled between the first current mirror circuit and the second current mirror circuit.

In one preferred embodiment, the first current mirror circuit includes: a plurality of bias transistors configured to generate a bias voltage at a bias node according to the reference current; and a mirror transistor configured to generate the mirror output current according to the bias voltage, wherein a gate of the mirror transistor is biased by the bias voltage; wherein, during the predetermined period, a number of the plurality of bias transistors electrically connected to the reference current is adjusted to reduce the mirror ratio.

In one preferred embodiment, the plurality of bias transistors includes a first bias transistor and a second bias transistor, wherein a gate of the first bias transistor and a gate of the second bias transistor are coupled to the bias node, and the gate and a drain of the first bias transistor are electrically connected with each other, wherein the first current mirror circuit further includes: an adjustment switch coupled between the gate and a drain of the second bias transistor and configured to conduct the gate and the drain of the second bias transistor during the predetermined period to reduce the mirror ratio.

In one preferred embodiment, the first current mirror circuit further includes: a bias cascode transistor coupled in series with the first bias transistor and configured to regulate a voltage of the drain of the first bias transistor; and a mirror cascode transistor coupled in series with the mirror transistor and configured to regulate a voltage of a drain of the mirror transistor.

In one preferred embodiment, a gate and a drain of the bias cascode transistor are electrically connected with each other, and the gate of the bias cascode transistor and a gate of the mirror cascode transistor are electrically connected to each other.

In one preferred embodiment, the first current mirror circuit further includes: a bias-side amplifier configured to amplify a voltage of the drain of the first bias transistor to generate a bias-side amplified voltage, so as to control a gate of the bias cascode transistor, thereby regulating a voltage of the drain of the first bias transistor; and a mirror-side amplifier configured to amplify a voltage of the drain of the mirror transistor to generate a mirror-side amplified voltage, so as to control a gate of the mirror cascode transistor, thereby regulating a voltage of the drain of the mirror transistor.

In one preferred embodiment, the bias-side amplifier includes a bias-side amplifier transistor, wherein a gate and a drain of the bias-side amplifier transistor are coupled to the drain of the first bias transistor and the gate of the bias cascode transistor respectively, thereby regulating a voltage of the drain of the first bias transistor to be close to a conduction threshold of the bias-side amplifier transistor; and the mirror-side amplifier includes a mirror-side amplifier transistor, wherein a gate and a drain of the mirror-side amplifier transistor are coupled to the drain of the mirror transistor and the gate of the mirror cascode transistor respectively, thereby regulating a voltage of the drain of the mirror transistor to be close to a conduction threshold of the mirror-side amplifier transistor.

In one preferred embodiment, the gate driver circuit further includes a pulse generator configured to detect a time point at which a drive input signal is enabled to generate an adjustment pulse, wherein a width of the adjustment pulse corresponds to the predetermined period, wherein the adjustment pulse is configured to control the adjustment switch.

In one preferred embodiment, the width of the adjustment pulse is positively correlated with a bandwidth of the bias-side amplifier and/or a bandwidth of the mirror-side amplifier.

The present invention aims to address the deficiencies of the prior art by providing a gate driver circuit capable of preventing spikes.

The advantages of the present invention are that the gate driver circuit of the present invention can prevent the occurrence of spikes in the soft-start current, thereby ensuring that the rise time of the power switch control signal does not become too short, so as to achieve the effect of soft start.

This document has detailed the present invention through specific embodiments. However, these descriptions are intended to facilitate of the understanding present invention's objectives, technical contents, features, and achieved effects, rather than to limit the scope of the present invention. Various combinations and equivalent variations, under the spirit of the present invention, can be conceived by those skilled in the art without departing from the scope and spirit of the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
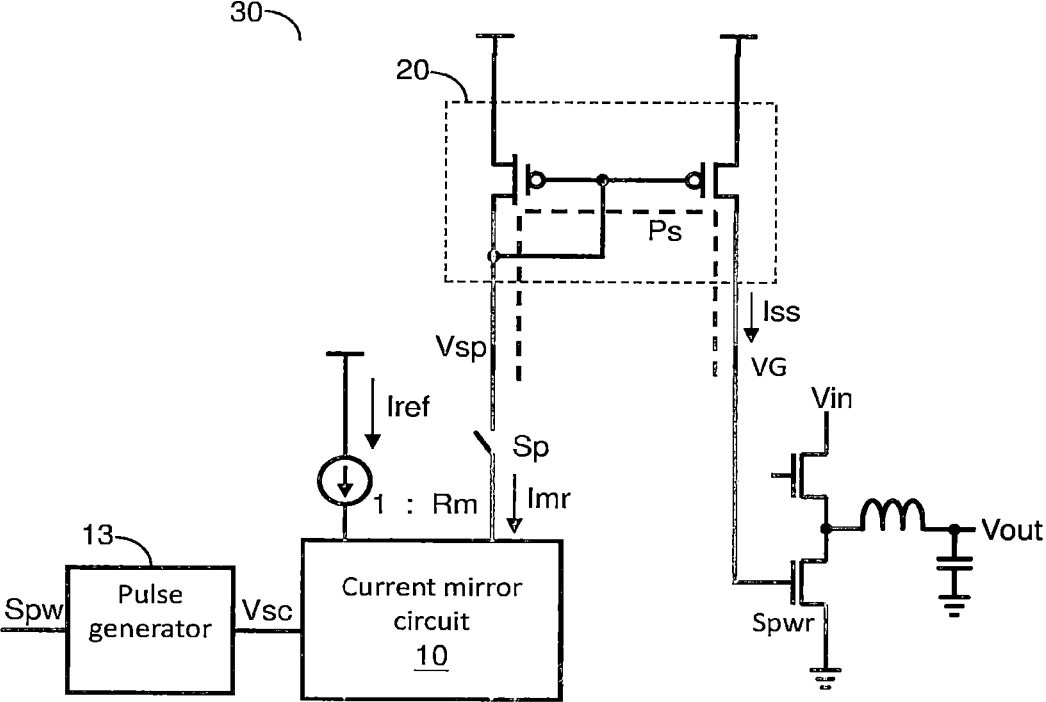
FIG. 2 shows a circuit schematic diagram of a gate driver circuit according to one embodiment of the present invention.
Figure 7:
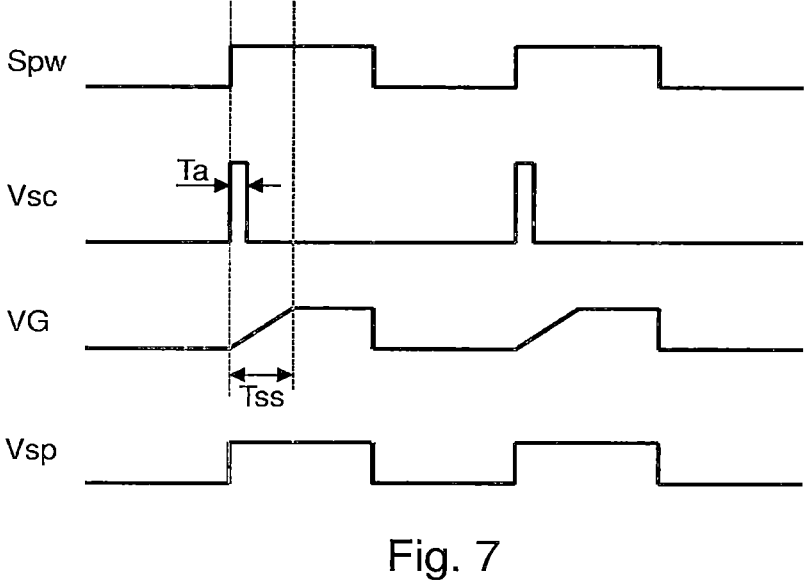
FIG. 7 shows signal waveform diagram of related signals of a gate driver circuit according to one embodiment of the present invention.

FIG. 2 shows a circuit schematic diagram of a gate driver circuit according to one embodiment of the present invention. FIG. 7 shows signal waveform diagram of the related signals of the gate driver circuit according to one embodiment of the present invention. Please refer to both FIG. 2 and FIG. 7. The gate driver circuit 30 of the present invention is configured to provide a soft-start current Iss to a gate of a power switch Spwr during a soft-start period Iss, thereby soft-starting the power switch Spwr. The power switch Spwr can be, for example, a low-side switch in a buck converter circuit as shown in FIG. 2. The gate driver circuit 30 includes a current mirror circuit 10, a path switch Sp, a current mirror circuit 20, and a pulse generator 13. The current mirror circuit 10 is configured to mirror a reference current Iref according to a mirror ratio Rm to generate a mirror output current Imr, wherein the soft-start current Iss is generated according to the mirror output current Imr. The path switch Sp is coupled to a signal path Ps between the mirror output current Imr and the soft-start current Iss, and the path switch Sp is configured to turn off the signal path Ps when the power switch Spwr is turned off.

Please refer to both FIG. 2 and FIG. 7. During a predetermined period Ta within the soft-start period Tss, the gate driver circuit reduces the mirror ratio Rm of the current mirror circuit 10, thereby compensating for the spike caused by the path switch Sp being turning on during the soft-start period Tss, so as to prevent the soft-start current Iss from surging during the soft-start period Tss. The current mirror circuit 20 is configured to mirror the mirror output current Imr to generate the soft-start current Iss, where the path switch Sp is coupled between the current mirror circuit 10 and the current mirror circuit 20. The pulse generator 13 is configured to detect the time point when the drive input signal Spw is enabled to generate an adjustment pulse Vsc. In one embodiment, a width of the adjustment pulse Vsc corresponds to the predetermined period Ta.

Figure 1:
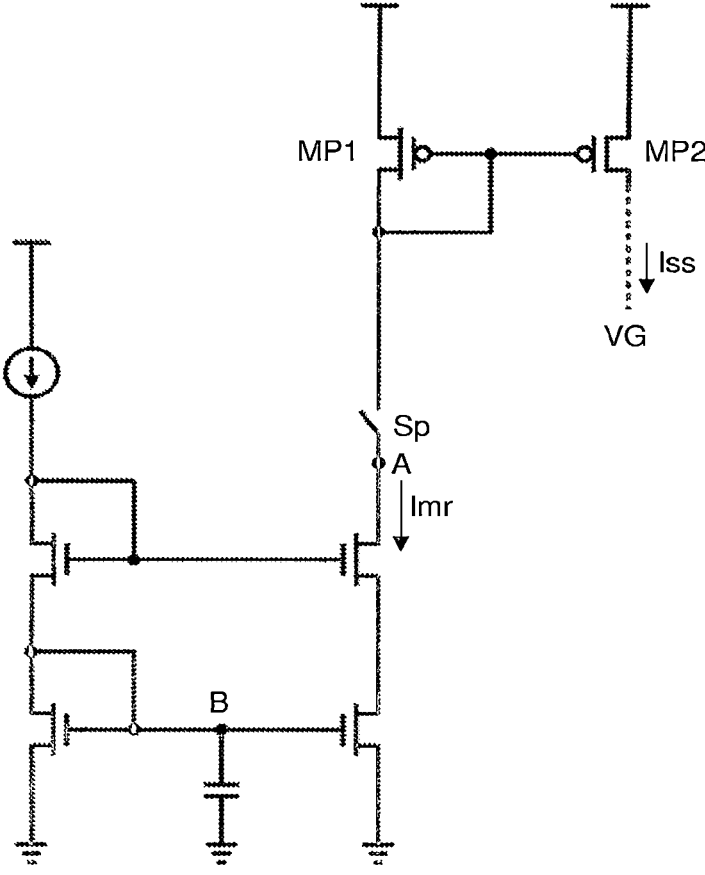
FIG. 1 shows a circuit schematic diagram of a prior art gate driver circuit.
Figure 8:
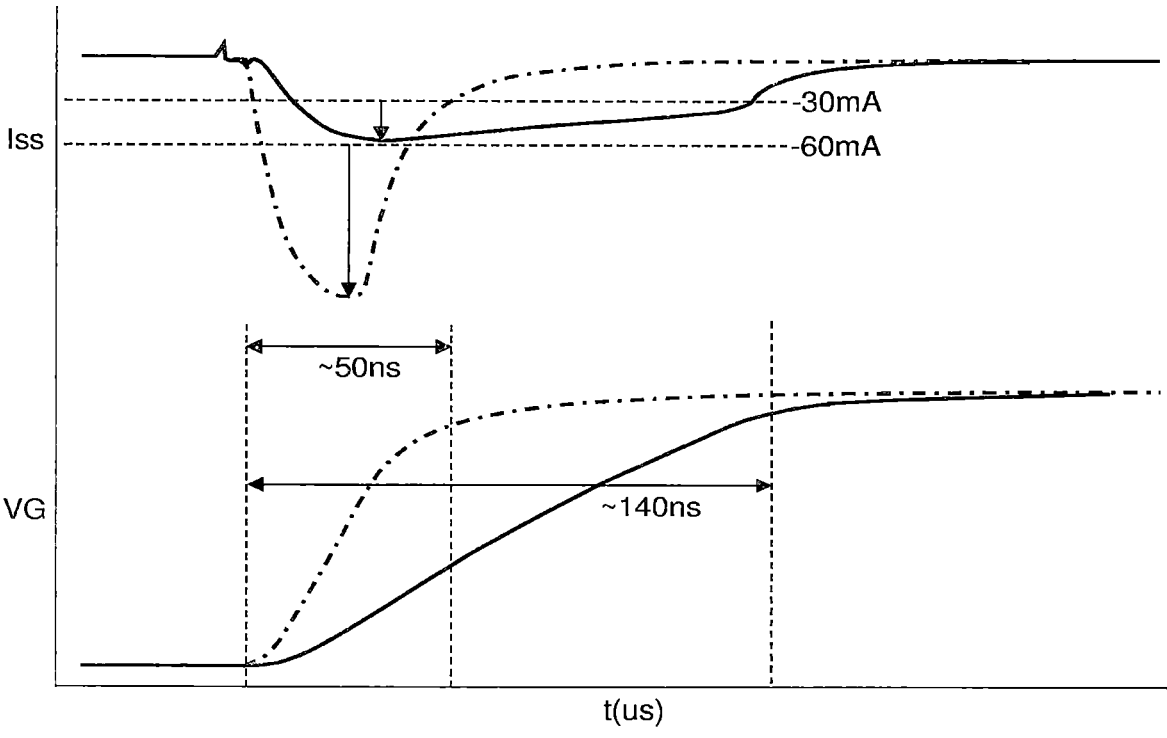
FIG. 8 shows signal waveform diagram of related signals of a prior art gate driver circuit.

FIG. 8 shows signal waveform diagram of the related signals of a prior art gate driver circuit. The soft-start current Iss and the power switch control signal VG are shown in FIG. 8. In FIG. 8, the dashed line in the upper part represents the soft-start current Iss at a control target value of −60 mA, while the solid line in the upper part represents the soft-start current Iss at a control target value of −30 mA. The dashed line in the lower part of FIG. 8 represents the power switch control signal VG at a control target value of −60 mA, while the solid line in the lower part represents the power switch control signal VG at a control target value of −30 mA. Please refer to both FIG. 1 and FIG. 8. During the soft-start period, the turning on of the path switch Sp causes a spike in the mirror output current Imr, which in turn causes a spike in the soft-start current Iss. Particularly, the soft-start current Iss at a control target value of −60 mA almost shifts to −160 mA, causing the rise time of the power switch control signal VG to be too short. For example, as shown in the lower part of FIG. 8, the rise time of the power switch control signal VG at a control target value of −60 mA is about 50 ns, while the rise time of the power switch control signal VG at a control target value of −30 mA is about 140 ns, failing to achieve the expected soft-start effect.

Figure 3:
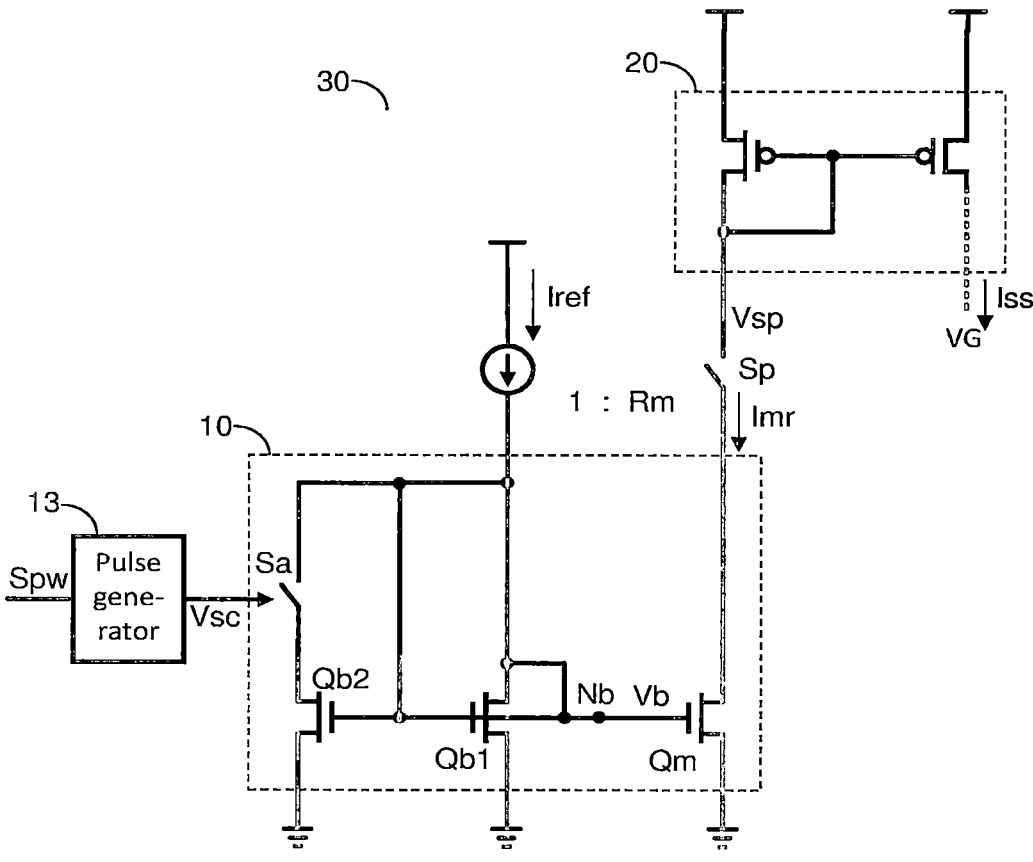
FIG. 3 shows a circuit schematic diagram of a gate driver circuit according to another embodiment of the present invention.

FIG. 3 shows a circuit schematic diagram of a gate driver circuit according to another embodiment of the present invention. This embodiment corresponds to a specific embodiment of FIG. 2. In this embodiment, the current mirror circuit 10 includes plural bias transistors Qb1, Qb2, and a mirror transistor Qm. The mirror transistor Qm is configured to generate a bias voltage Vb at a bias node Nb according to the reference current Iref. The gate of the mirror transistor Om is biased by the bias voltage Vb to generate the mirror output current Imr. In this embodiment, the gate driver circuit reduces the mirror ratio Rm during the predetermined period Ta by adjusting the number of plural bias transistors Qb1 and Qb2 electrically connected to the reference current Iref. The gates of the bias transistors Qb1 and Qb2 are coupled to the bias node Nb, and the gate and the drain of the bias transistor Qb1 are electrically connected. As shown in FIG. 3, the current mirror circuit 10 further includes an adjustment switch Sa coupled between the gate and the drain of the bias transistor Qb2 and configured to conduct the gate and the drain of the bias transistor Qb2 during the predetermined period Ta, thereby reducing the mirror ratio Rm. The adjustment pulse Vsc is configured to control the adjustment switch Sa.

FIG. 7 shows signal waveform diagram of the related signals of a gate driver circuit according to one embodiment of the present invention. The drive input signal Spw, the adjustment pulse Vsc, the power switch control signal VG, and the path switch control signal Vsp are shown in FIG. 7. To reduce the impact of spikes, the present invention switches the adjustment pulse Vsc to an enabling level during the predetermined period Ta, so as to conduct the adjustment switch Sa, such that the bias transistor Qb2 is connected in parallel with the bias transistor Qb1. This makes the equivalent ratio of the parallel-connected bias transistors Qb2 and Qb1 to that of the mirror transistor Qm for example doubled, compared to the adjustment switch Sa being off, thereby reducing the mirror ratio Rm and reducing the mirror output current Imr to ½·Iref, thus avoiding a spike in the soft-start current Iss.

Please refer to both FIG. 7 and FIG. 3 again. After the predetermined period Ta, the adjustment pulse Vsc switches to a disabling level, causing the adjustment switch Sa to be non-conductive, thereby restoring the mirror output current Imr to 1 time the reference current Iref, so as to maintain at the predetermined target value (e.g., −60 mA, −30 mA), ensuring that the rise time of the power switch control signal VG can also reach the predetermined target value, achieving the soft-start effect.

Figure 4:
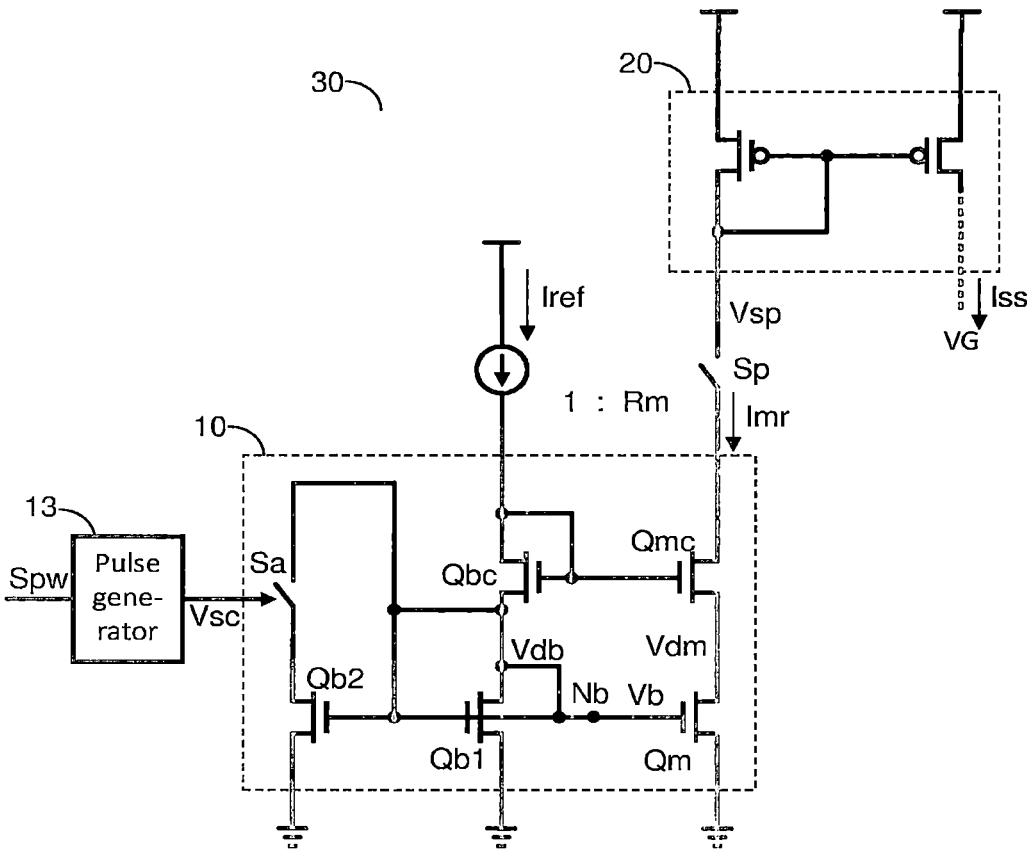
FIG. 4 shows a circuit schematic diagram of a gate driver circuit according to yet another embodiment of the present invention.

FIG. 4 shows a circuit schematic diagram of a gate driver circuit according to yet another embodiment of the present invention. This embodiment is similar to the embodiment shown in FIG. 3, but the difference therebetween is that as shown in FIG. 4, the current mirror circuit 10 further includes a bias cascode transistor Qbc and a mirror cascode transistor Qmc. The bias cascode transistor Qbc is coupled in series with the bias transistor Qb1 to regulate the voltage Vdb of the drain of the bias transistor Qb1. The mirror cascode transistor Qmc is coupled in series with the mirror transistor Qm to regulate the voltage Vdm of the drain of the mirror transistor Om. The gate and the drain of the bias cascode transistor Qbc are electrically connected, and the gate of the bias cascode transistor Qbc is electrically connected to the gate of the mirror cascode transistor Qmc. By employing the bias cascode transistor Qbc and the mirror cascode transistor Qmc, the on-resistance Rds can be closer to infinity, thereby making the equivalent output impedance of the current mirror circuit 10 closer to infinity, and making the current mirror ratio of the current mirror circuit 10 closer to the predetermined value.

Figure 5:
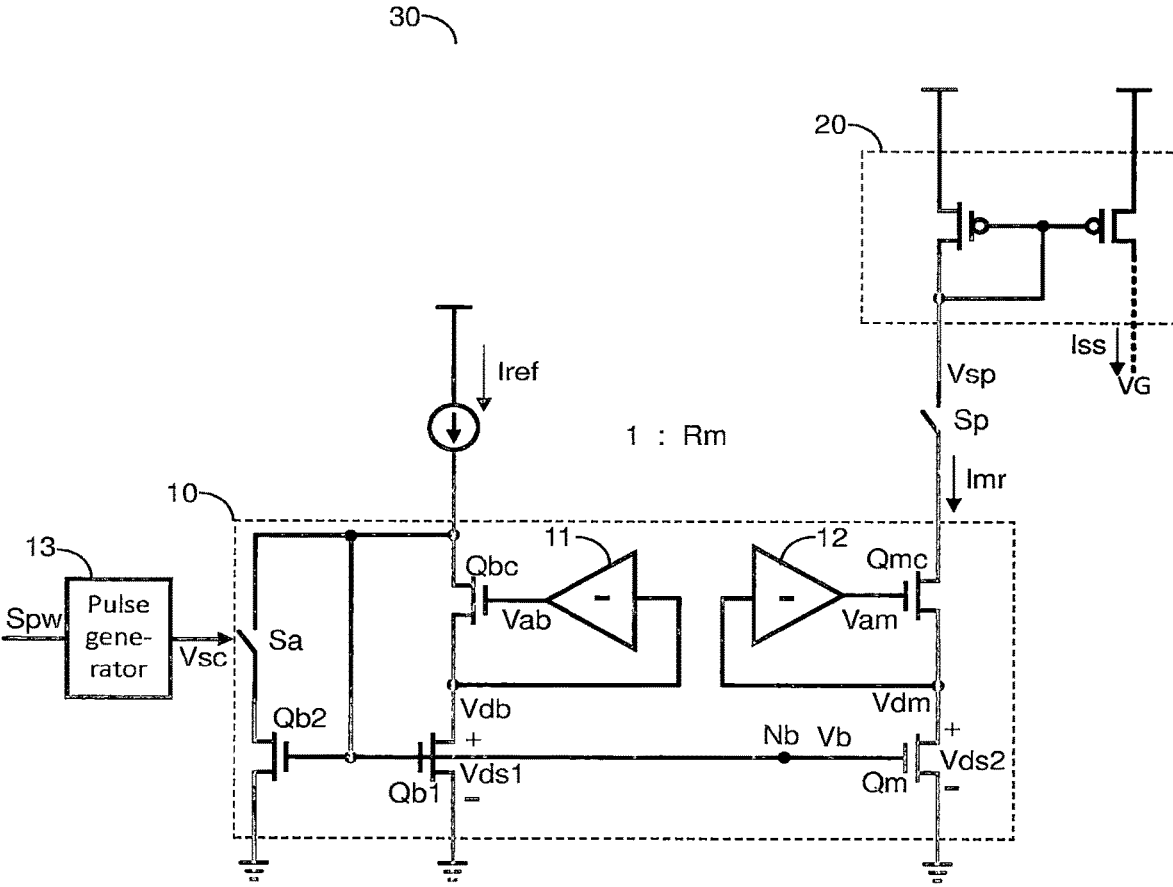
FIG. 5 shows a circuit schematic diagram of a gate driver circuit according to still another embodiment of the present invention.

FIG. 5 shows a circuit schematic diagram of a gate driver circuit according to still another embodiment of the present invention. This embodiment is similar to the embodiment shown in FIG. 4, but the difference therebetween is that as shown in FIG. 5, the current mirror circuit 10 further includes a bias-side amplifier 11 and a mirror-side amplifier 12. The bias-side amplifier 11 is configured to amplify the voltage Vdb of the drain of the bias transistor Qb1 to generate a bias-side amplified voltage Vab to control the gate of the bias cascode transistor Qbc, thereby regulating the voltage Vdb of the drain of the bias transistor Qb1, and thus locking the drain-source voltage Vds1 of the bias transistor Qb1. The mirror-side amplifier 12 is configured to amplify the voltage Vdm of the drain of the mirror transistor Om to generate a mirror-side amplified voltage Vam to control the gate of the mirror cascode transistor Qmc, thereby regulating the drain voltage Vdm of the mirror transistor Qm, and thus locking the drain-source voltage Vds2 of the mirror transistor Qm. This makes the equivalent output impedance of the current mirror circuit 10 closer to infinity and the current mirror ratio of the current mirror circuit 10 further closer to the predetermined value.

Figure 6:
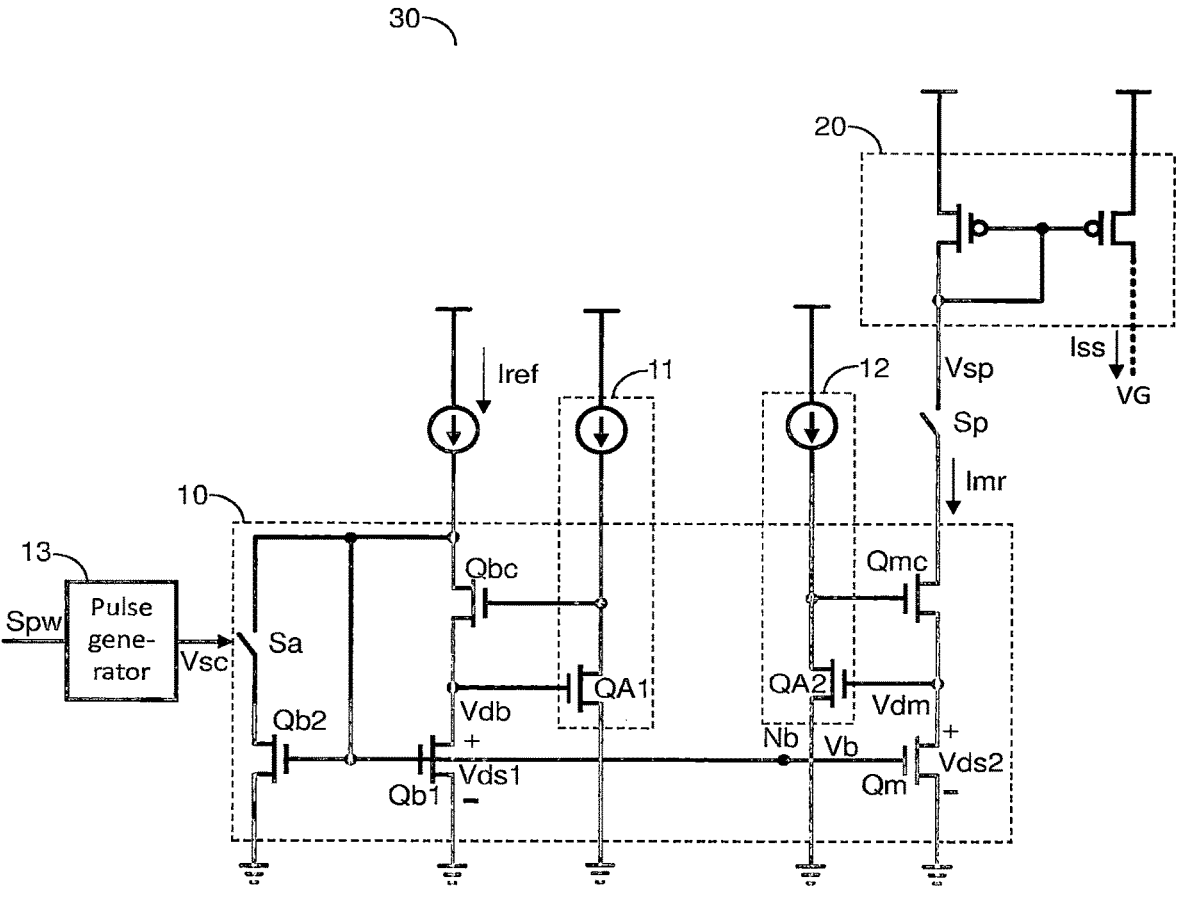
FIG. 6 shows a circuit schematic diagram of a gate driver circuit according to yet another embodiment of the present invention.

FIG. 6 shows a circuit schematic diagram of a gate driver circuit according to yet another embodiment of the present invention. This embodiment corresponds to a specific embodiment of FIG. 5. In this embodiment, the bias-side amplifier 11 includes a bias-side amplifier transistor QA1, with the gate and the drain of the bias-side amplifier transistor QA1 respectively coupled to the drain of the bias transistor Qb1 and the gate of the bias cascode transistor Qbc, thereby regulating the voltage Vdb of the drain of the bias transistor Qb1 to be close to a conduction threshold of the bias-side amplifier transistor QA1. This locks the drain-source voltage Vds1 of the bias transistor. Qb1. The mirror-side amplifier 12 includes a mirror-side amplifier transistor QA2, with the gate and the drain of the mirror-side amplifier transistor QA2 respectively coupled to the drain of the mirror transistor Qm and the gate of the mirror cascode transistor Qmc, thereby regulating the voltage Vdm of the drain of the mirror transistor Qm to be close to the conduction threshold of the mirror-side amplifier transistor QA2. This locks the drain-source voltage Vds2 of the mirror transistor Qm.

In one embodiment, please refer to both FIG. 5 and FIG. 7. The width of the adjustment pulse Vsc is positively correlated with the bandwidth of the bias-side amplifier 11 and/or the bandwidth of the mirror-side amplifier 12.

Figure 9:
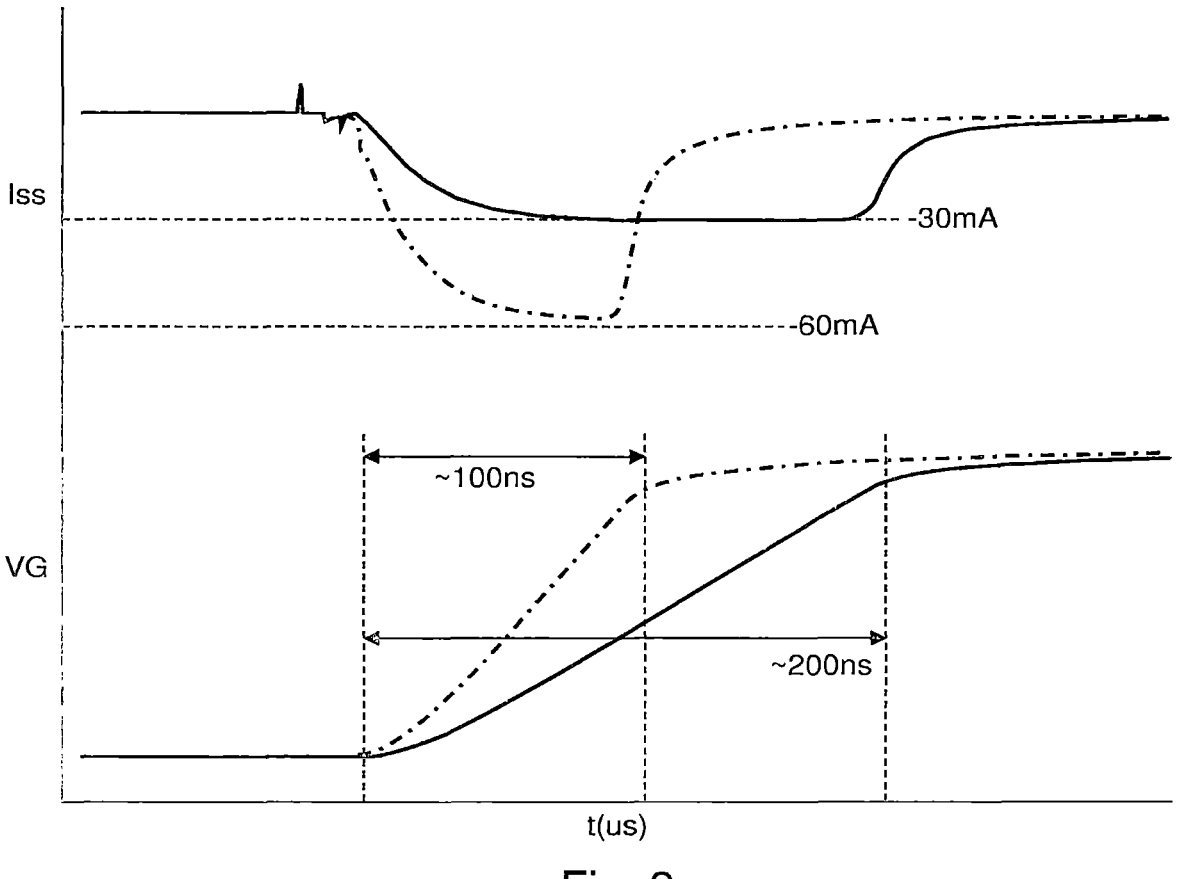
FIG. 9 shows signal waveform diagram of related signals of a gate driver circuit according to one embodiment of the present invention.

FIG. 9 shows signal waveform diagram of the related signals of the gate driver circuit according to one embodiment of the present invention. The soft-start current Iss and the power switch control signal VG are shown in FIG. 9. In the upper part of FIG. 9, the dashed line represents the soft-start current Iss at a control target value of −60 mA, while the solid line represents the soft-start current Iss at a control target value of −30 mA. In the lower part of FIG. 9, the dashed line represents the power switch control signal VG at a control target value of −60 mA, while the solid line represents the power switch control signal VG at a control target value of −30 mA. As shown in FIG. 9, the soft-start current Iss generated by the gate driver circuit of the present invention can be controlled to be very close to the control target value. For example, the soft-start currents Iss at a control target value of −60 mA and −30 mA shown in the upper part of FIG. 9 are very close to the control target values of −60 mA and −30 mA respectively, without causing undesirable spikes due to the switching of the switch Sp. Therefore, the rise time of the power switch control signal VG does not become too short, so as to achieve the required rise time length for soft start. For example, as shown in the lower part of FIG. 9, the rise time of the power switch control signal VG at a control target value of −60 mA is about 100 ns, and the rise time at a control target value of −30 mA is about 200 ns, which achieve the required rise time length for the corresponding soft start.

In summary, the gate driver circuit of the present invention can prevent the occurrence of spikes in the soft-start current, thereby ensuring that the rise time of the power switch control signal does not become too short, so as to achieve the effect of soft start.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A gate driver circuit for providing a soft-start current to a gate of a power switch during a soft-start period to soft-start the power switch, the gate driver circuit comprising:

a first current mirror circuit configured to mirror a reference current according to a mirror ratio to generate a mirror output current, wherein the soft-start current is generated according to the mirror output current; and a path switch coupled to a signal path between the mirror output current and the soft-start current and configured to turn off the signal path when the power switch is turned off;

wherein, during a predetermined period within the soft-start period, the mirror ratio of the first current mirror circuit is reduced to compensate for a spike caused by the path switch being turning on during the soft-start period, so as to prevent the soft-start current from surging during the soft-start period;

wherein the first current mirror circuit includes:

a plurality of bias transistors configured to generate a bias voltage at a bias node according to the reference current; and a mirror transistor configured to generate the mirror output current according to the bias voltage, wherein a gate of the mirror transistor is biased by the bias voltage;

wherein, during the predetermined period, a number of the plurality of bias transistors electrically connected to the reference current is adjusted to reduce the mirror ratio.

2. The gate driver circuit of claim 1, further comprising a second current mirror circuit configured to mirror the mirror output current to generate the soft-start current, wherein the path switch is coupled between the first current mirror circuit and the second current mirror circuit.

3. The gate driver circuit of claim 1, wherein the plurality of bias transistors includes a first bias transistor and a second bias transistor, wherein a gate of the first bias transistor and a gate of the second bias transistor are coupled to the bias node, and the gate and a drain of the first bias transistor are electrically connected with each other, wherein the first current mirror circuit further includes:

an adjustment switch coupled between the gate and a drain of the second bias transistor and configured to conduct the gate and the drain of the second bias transistor during the predetermined period to reduce the mirror ratio.

4. The gate driver circuit of claim 3, wherein the first current mirror circuit further includes:

a bias cascode transistor coupled in series with the first bias transistor and configured to regulate a voltage of the drain of the first bias transistor; and a mirror cascode transistor coupled in series with the mirror transistor and configured to regulate a voltage of a drain of the mirror transistor.

5. The gate driver circuit of claim 4, wherein a gate and a drain of the bias cascode transistor are electrically connected with each other, and the gate of the bias cascode transistor and a gate of the mirror cascode transistor are electrically connected to each other.

6. The gate driver circuit of claim 4, wherein the first current mirror circuit further includes:

a bias-side amplifier configured to amplify a voltage of the drain of the first bias transistor to generate a bias-side amplified voltage, so as to control a gate of the bias cascode transistor, thereby regulating a voltage of the drain of the first bias transistor; and a mirror-side amplifier configured to amplify a voltage of the drain of the mirror transistor to generate a mirror-side amplified voltage, so as to control a gate of the mirror cascode transistor, thereby regulating a voltage of the drain of the mirror transistor.

7. The gate driver circuit of claim 6, wherein:

the bias-side amplifier includes a bias-side amplifier transistor, wherein a gate and a drain of the bias-side amplifier transistor are coupled to the drain of the first bias transistor and the gate of the bias cascode transistor respectively, thereby regulating a voltage of the drain of the first bias transistor to be close to a conduction threshold of the bias-side amplifier transistor; and the mirror-side amplifier includes a mirror-side amplifier transistor, wherein a gate and a drain of the mirror-side amplifier transistor are coupled to the drain of the mirror transistor and the gate of the mirror cascode transistor respectively, thereby regulating a voltage of the drain of the mirror transistor to be close to a conduction threshold of the mirror-side amplifier transistor.

8. The gate driver circuit of claim 6, further comprising a pulse generator configured to detect a time point at which a drive input signal is enabled to generate an adjustment pulse, wherein a width of the adjustment pulse corresponds to the predetermined period, wherein the adjustment pulse is configured to control the adjustment switch.

9. The gate driver circuit of claim 8, wherein the width of the adjustment pulse is positively correlated with a bandwidth of the bias-side amplifier and/or a bandwidth of the mirror-side amplifier.

* * * * *